United States Patent
Lee et al.

(10) Patent No.: US 8,330,916 B2
(45) Date of Patent: Dec. 11, 2012

(54) LIQUID CRYSTAL DISPLAY AND METHOD OF FABRICATING THE SAME TO HAVE TFT'S WITH PIXEL ELECTRODES INTEGRALLY EXTENDING FROM ONE OF THE SOURCE/DRAIN ELECTRODES

(75) Inventors: Je-Hun Lee, Seoul (KR); Do-Hyun Kim, Seoul (KR); Tae-Sang Kim, Seoul (KR); Kyung-Seok Son, Seoul (KR); Chang-Oh Jeong, Suwon-si (KR)

(73) Assignee: Samsung Display Co., Ltd. (KR)

( * ) Notice: Subject to any disclaimer, the term of this patent is extended or adjusted under 35 U.S.C. 154(b) by 576 days.

(21) Appl. No.: 12/344,075

(22) Filed: Dec. 24, 2008

(65) Prior Publication Data

US 2009/0174835 A1 Jul. 9, 2009

(30) Foreign Application Priority Data

Jan. 4, 2008 (KR) .................. 10-2008-0001449

(51) Int. Cl.
*G02F 1/1343* (2006.01)

(52) U.S. Cl. .............. 349/139; 349/47; 349/38

(58) Field of Classification Search .......... 349/43, 349/47, 38, 138, 139, 141, 158, 106, 46; 438/30; 257/59, E21.535, E27.111

See application file for complete search history.

(56) References Cited

U.S. PATENT DOCUMENTS

| | | | | |
|---|---|---|---|---|
| 5,808,715 | A * | 9/1998 | Tsai et al. | 349/122 |
| 6,533,965 | B1 * | 3/2003 | Sasaki et al. | 252/519.5 |
| 6,816,209 | B2 * | 11/2004 | Tsujimura et al. | 349/43 |
| 7,566,904 | B2 * | 7/2009 | Ishii | 257/59 |
| 7,839,475 | B2 * | 11/2010 | Yang | 349/139 |
| 7,864,254 | B2 * | 1/2011 | Kim et al. | 349/40 |
| 7,947,525 | B2 * | 5/2011 | Shih | 438/69 |

* cited by examiner

*Primary Examiner* — Thoi Duong
(74) *Attorney, Agent, or Firm* — Innovation Counsel LLP

(57) ABSTRACT

A liquid crystal display (LCD) includes thin film transistors (TFTs) each having spaced apart source/drain electrodes and an oxide-type semiconductive film disposed over and between the source/drain electrodes to define an active layer. Each of the source/drain electrodes includes a portion of a subdivided transparent conductive layer where one subdivision of the transparent conductive layer continues from within its one of the source/drain electrodes to define an optically exposed pixel-electrode that is reliably connected integrally to the one source/drain electrode. Mass production costs can be reduced and production reliability increased because a fewer number of photolithographic masks can be used to form the TFTs.

14 Claims, 13 Drawing Sheets

LIQUID CRYSTAL DISPLAY AND METHOD OF FABRICATING THE SAME TO HAVE TFT'S WITH PIXEL ELECTRODES INTEGRALLY EXTENDING FROM ONE OF THE SOURCE/DRAIN ELECTRODES

This application claims priority from Korean Patent Application No. 10-2008-0001449 filed on Jan. 4, 2008 in the Korean Intellectual Property Office, the disclosure of which is incorporated herein by reference in its entirety.

BACKGROUND

1. Field of Invention

The present disclosure of invention relates to a liquid crystal display (LCD) and a method of fabricating the same, and more particularly, to a liquid crystal display (LCD), which includes thin film transistors (TFTs) that can be mass produced more efficiently (fewer process steps) and more reliability (due to fewer masking steps and due to self-alignment plus monolithic integration of parts).

2. Description of Related Technology

A liquid crystal display (LCD) typically includes a first substrate having a plurality of pixel electrodes provided thereon, a second substrate having a one or more common electrodes provided thereon, and a liquid crystal molecular layer which has dielectric anisotropy and is interposed between the first and second substrates. The LCD can selectively change the alignment of liquid crystal molecules in the liquid crystal molecular layer by forming different electric field orientations between specific ones of the pixel electrodes and the one or more common electrodes and/or by adjusting the intensity of the formed electric fields. In so doing, the LCD can control the amount of light transmitting through the liquid crystal molecular layer and can thus display a desired image. Thin film transistors (TFTs) are widely used as switching devices for controlling the electric fields formed in such LCDs.

A TFT is a switching device which can be integrally formed on a transparent substrate and typically includes a semiconductive active layer (e.g., amorphous silicon) having a gate electrode formed over a channel portion of the active layer, a source electrode at one side, and a drain electrode spaced away at another side of the channel portion. (Incidentally, the definition of which is the source electrode and which is the drain electrode of a TFT can vary and is sometimes swapped. Suffice it to say here that the TFT includes spaced apart source/drain regions with a channel region therebetween where conduction of charge carriers through the channel region can be selectively switched on and off.) When a voltage higher than a predetermined threshold level (Vt) is applied to the gate electrode, a channel regions in the active layer becomes conductive. This allows an electric current to flow between the source electrode and the drain electrode. The active layer of the TFT may be made of amorphous silicon (a-Si) or polysilicon (p-Si). In addition, the TFT may have a top-gate structure, in which the gate electrode is disposed above the active layer, or a bottom-gate structure, in which the gate electrode is disposed under the active layer.

Typically, a connection via is formed between a given one of the source/drain regions of a TFT and a separate pixel-electrode so that the two are in good electrical communication with one another. However, during mass production, providing precise alignment of the via between given source/drain region and the pixel-electrode and providing consistently good electrical communication through the via can be problematic.

SUMMARY

In order to fabricate an LCD including TFTs, a plurality of photolithographic mask processes are typically used to form the active layer, a gate electrode, a contact hole, a source electrode and a drain electrode, a via hole, and a pixel electrode. If the number of mask processes can be reduced, manufacturing efficiency can be enhanced. If need for the via hole connection between the pixel-electrode and the source/drain regions that connects to the pixel-electrode can be eliminated, mass production reliability can be enhanced.

In addition, the active layer should be made of a material having superior electrical characteristics so that each TFT can operate in a reliable manner, and the structure of each TFT including the active layer should be arranged to be effective as a switching device that operatively connects to the pixel-electrode.

The present disclosure provides a method of fabricating an LCD which includes TFTs with enhanced manufacturing efficiency and thus lower cost, plus enhanced reliability.

According to one aspect of the present disclosure, there is provided an LCD including: a pixel electrode and a buffer layer formed on an insulation substrate, wherein the buffer layer separated from the pixel electrode and is formed on a level with the pixel electrode; a source electrode formed on the buffer layer; a drain electrode formed on the pixel electrode; an active layer formed on the source electrode and the drain electrode; and a gate electrode formed on the active layer.

According to another aspect of the present disclosure, there is provided a method of fabricating an LCD. The method includes: forming a pixel electrode and a buffer layer on an insulation substrate, wherein the buffer layer is formed on a level with the pixel electrode; forming a source electrode on the buffer layer and forming a drain electrode on the pixel electrode; and forming an active layer and a gate electrode on the source electrode and the drain electrode.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
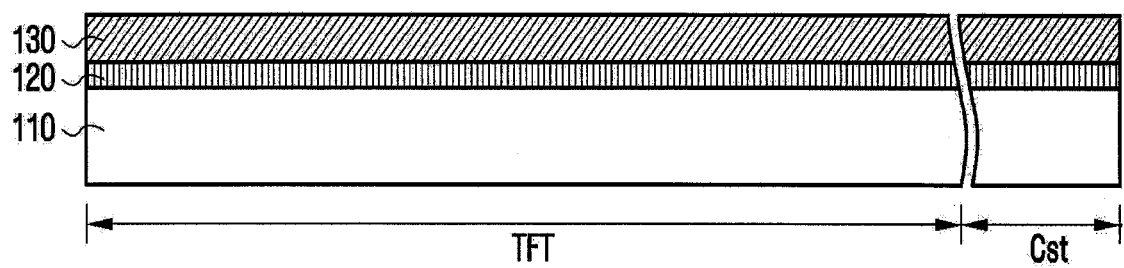
FIGS. 1 through 6 illustrate initial processes performed to fabricate liquid crystal displays (LCDs) according to various exemplary embodiments of the present disclosure.

Advantages and features of LCD's formed in accordance with the present disclosure and methods of accomplishing the same may be understood more readily by reference to the following detailed descriptions and the accompanying drawings. The underlying innovation may, however, be embodied in many different forms and should not be construed as being limited to the embodiments set forth herein. Rather, these embodiments are provided so that this disclosure effectively conveys the concepts to those skilled in the art of mass producing liquid crystal displays (LCD's). Like reference numerals refer to like elements throughout the specification. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms unless expressly stated at the relevant passage. These terms are generally used to distinguish one element, component or section from another element, component or section. Thus, a first element, component or section discussed below could be termed a second element, component or section without departing from the teachings of the present disclosure.

The terminology used herein is for the purpose of describing particular embodiments only and is not intended to be limiting. As used herein, the singular forms are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this disclosure most closely pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a liquid crystal display (LCD) and a method of fabricating the same according to exemplary embodiments will be described with reference to the attached drawings. Each of the attached drawings illustrates both of a region in which a thin film transistor (TFT) is being formed and a region in which a corresponding storage capacitor Cst is being formed.

An LCD and a method of fabricating the same according to a first exemplary embodiment will now be described with reference to FIGS. 1 through 13. FIGS. 1 through 6 illustrate common processes performed to fabricate LCDs according to exemplary embodiments of the present disclosure. FIGS. 7 through 13 illustrate processes performed to fabricate the LCD according to the first exemplary embodiment.

Referring to FIG. 1, a conductive material layer 120 for forming a transparent pixel electrode; and a first metal layer 130 for forming source and drain electrodes are sequentially formed on an insulation substrate 110 in the order shown.

The insulation substrate 110 may be made of a transparent glass and/or of a transparent plastic. In particular, a soda-lime glass may be used for forming at least part of the insulation substrate 110. As understood by skilled practitioners, soda-lime glass is a compound of calcium oxide and sodium oxide. Although soda-lime glass can be obtained at relatively low cost and it has good processability, it is generally not resistant to deformation in the presence of high temperatures. According to the present disclosure however, soda-lime glass can be used and maintained under low temperature process conditions during formation of TFTs, which will be described later. Therefore, soda-lime glass can be used for the insulation substrate 110 to thereby reduce manufacturing costs.

The conductive material layer 120 for forming the transparent pixel electrode may be initially deposited as a transparent conductive film having an amorphous structure or a partially amorphous structure. For example, the conductive layer 120 for the pixel electrode may be amorphous-indium tin oxide (a-ITO), amorphous-indium zinc oxide (a-IZO), or partially amorphous/partially crystalline ITO deposited on the substrate 110 at a temperature of about 200° C. or below.

The first metal layer 130 may be formed by physical vapor deposition (PVD). The first metal layer 130 may be a single layer or a multi-layer made of copper (Cu), molybdenum (Mo), aluminum (Al), silver (Ag), titanium (Ti), niobium (Nb), tungsten (W), chrome (Cr), tantalum (Ta), or an alloy of the same. For example, the first metal layer 130 may be a single layer made of Ag, Cu or Mo.

Alternatively, the first metal layer 130 may be a multi-layer one including a plurality of layers having different physical characteristics. In this case, one of the layers may be made of metal with low resistivity, such as Al, Ag or Cu. Portions of the first metal layer 130 become a source electrode 132 (see FIG. 13) and a drain electrode 134 (see FIG. 13). Thus, if metal with low resistivity is used, the signal delay or voltage drop of each of the source electrode 132 and the drain electrode 134 can be reduced. On the other hand, the other one of the layers may be made of a material having superior contact and/or adhesion characteristics with a material used for the conductive material layer 120 for forming the transparent pixel electrode. For example, the other one of the layers may be made of Mo, Cr, Ti or Ta having superior contact characteristics with ITO and IZO. The multi-layer may be a double layer of Cr/Al or a triple layer of Mo/Al/Mo.

Figure 2A:
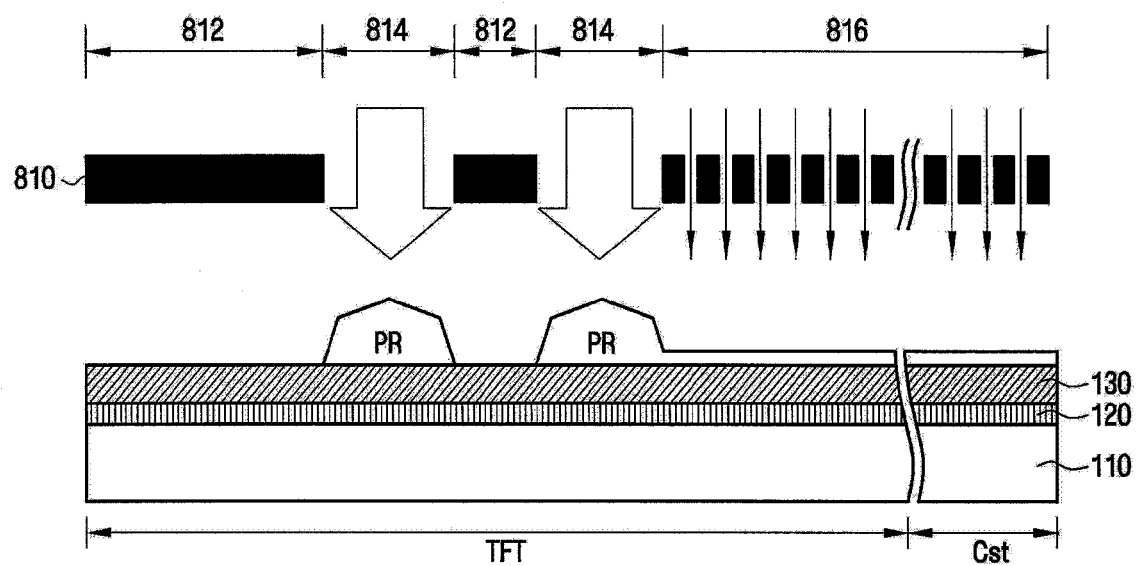

Referring to FIG. 2A, a photolithography process is performed using a first unitary mask 810 that has both wide openings and substantially narrower slits. In this process, a photoresist PR is first coated on the first metal layer 130. The photoresist PR may be a positive photoresist including a photoacid generator (PAG) or a negative photoresist including a photoactive crosslinker (PAC). As shown in the drawing, if the negative photoresist is used, outer side surfaces (sidewalls) of each photoresist pattern may slope at an angle close to 90 degrees. Thus, more precise patterning can be performed than with use of positive photoresist.

Next, exposure and development processes are performed using the first unitary mask 810, which has slits 816 precisely disposed relative to on-mask openings 814, so as to form photoresist patterns having different thicknesses in different and immediately adjacent lateral regions as shown. The first mask 810 includes a pair of relatively wide first openings or light-transmitting regions 814, adjacent or interposed light-blocking regions 812, and an adjacent grated or semi-transmitting region 816 in which the narrow slits are formed. After the exposure and development processes for the negative photoresist, the photoresist PR will be thickly coated under the light-transmitting regions 814 and comparatively more thinly but nonetheless continuously coated under the semi-transmitting region 816 while it is essentially not coated under the light-blocking regions 812.

Figure 2B:
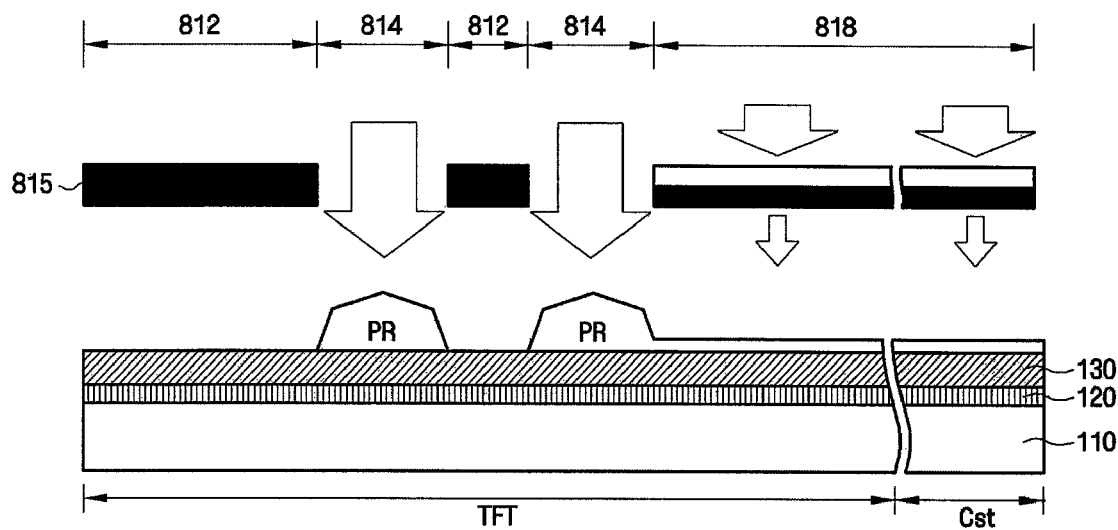

Referring to FIG. 2B, in an alternate embodiment, the photolithography process is performed using a unitary mask 815 which has a semi-transmitting portion 818 immediately adjacent to the right side opening 814, instead of the narrow slits region 816 of FIG. 2A. The alternate mask 815 having the semi-transmitting portion 818 is generally called a "halftone mask."

In this alternate process of FIG. 2B, the photoresist PR is coated. Then, the exposure and development processes are performed using the halftone mask 815, which has the semi-transmitting portion, so as to form photoresist patterns having different thicknesses. The mask 815 having the semi-transmitting portion includes light-transmitting regions 814, light-blocking regions 812, and the semi-transmitting region 818 in which the semi-transmitting portion is formed. After the exposure and development processes, the photoresist PR is thickly coated under the light-transmitting regions 814 and is thinly coated under the semi-transmitting region 818 while it is essentially not coated in the light-blocking regions 812.

Figure 3:
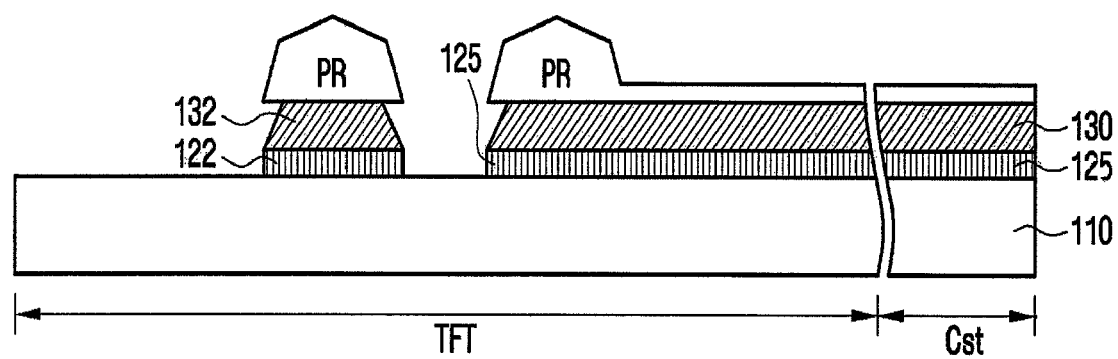

Referring to FIG. 3, with a first selective etching of material 120, that material layer is subdivided into a pixel electrode precursor region 125 and a buffer layer region 122, which region 122 is separated from the pixel electrode precursor region 125 and is formed on the same level with the pixel electrode precursor region 125. In addition, the first selective etching through the openings of the patterned PR layer also continues through the metal material layer 130 so that a source electrode 132 is formed on and in good contact with the conductive buffer layer 122. (The formed pixel electrode precursor region 125 will later function as a selective etch stop or etch barrier for a second etching as will be described below for FIGS. 4 and 5.)

Specifically in FIG. 3, in the light-blocking region 812, in which the photoresist PR is not coated, the first metal layer 130 and the conductive layer 120 for pixel electrode may be etched simultaneously to form the buffer layer 122, the pixel electrode (and Cst electrode) precursor region 125, and the source electrode 132. Here, since the conductive material layer 120 which initially forms pixel electrode precursor region 125 has been deposited in one embodiment with an amorphous structure or partially amorphous structure, in general it may be more easily etched using an etchant (and/or metal etch mechanism) which is also used to etch the harder-to-etch first metal layer 130 than if the initial conductive material layer 120 had been initially provided as polycrystalline or single crystal material.

For example, when the conductive layer 120 for pixel electrode is made of a-ITO and when the first metal layer 130 is made of metal containing Ag or Cu, they can be simultaneously etched using a wet etchant which contains less than 30% phosphoric acid, nitric acid, acetic acid, hydrochloric acid, or sulfuric acid.

Alternatively, when the conductive layer 120 for pixel electrode is made of a-ITO and when the first metal layer 130 is a single layer of Mo or a triple layer of Mo/Al/Mo, they can be simultaneously etched using an Al etchant (or etching mechanism selective for aluminum). In this case, the conductive layer 120 for pixel electrode may contain gallium (Ga), zinc (Zn), Ta, Ti or Al in addition to indium (In) or tin (Sn).

Figure 4:
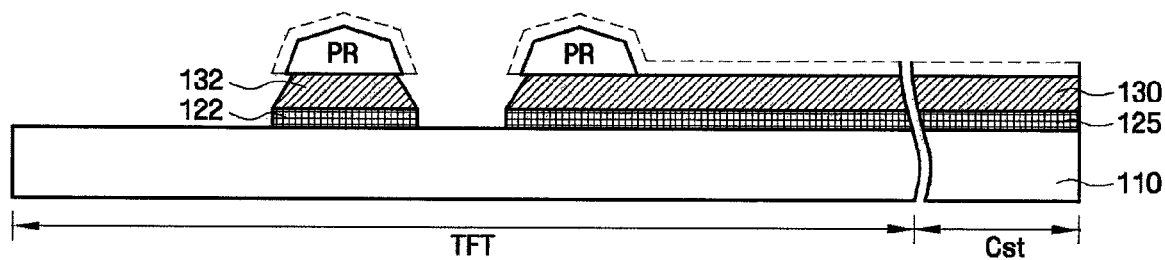

Referring to FIG. 4, a combination of a heat treatment process and a process of reducing the thickness of each photoresist pattern are next performed.

First, in the heat treatment process, the initially amorphous or partially amorphous material of the buffer layer 122 and the pixel electrode 125 are annealed and crystallized to change their structure from the amorphous structure to a substantially more crystalline structure. In FIGS. 4 through 13, the buffer layer 122 and the pixel electrode 125 are illustrated differently (with altered cross hatching) from in the previous drawings in order to represent their more crystalline structure which has been changed from the more amorphous structure due to the heat treatment.

For example, when a-ITO is annealed at a temperature of 200 to 250° C., it is crystallized into crystal ITO (c-ITO). The heat treatment process is performed to adjust the etching speed or selectivity of the buffer layer 122 and the pixel electrode 125 with respect to a pre-specified next-to-be used etchant described with reference to FIG. 5.

In the process of reducing thickness of each photoresist pattern, the photoresist PR is removed fully removed from the slitted or semi-transmitting region 816/818 (see FIGS. 2A and 2B) in which the photoresist PR was thinly coated while photoresist is retained in the more thickly coated regions 814.

Specifically, in one embodiment, a partial ashing process may be performed on the photoresist patterns to thereby partially remove the photoresist PR at least to a depth corresponding to the thickness of the photoresist PR in the region 816/818 where it was thinly coated but not to a depth where it also completely removes the thickly coated PR of regions 814. Consequently, reduced photoresist patterns as illustrated in FIG. 4 (where dashed represents the 'before' case and solid the 'after' case) can be obtained. When the partial ashing process is performed in order to reduce the photoresist patterns by a uniform thickness, the ashing speed may be reduced by minimizing the flux of supplied oxygen ($O_2$) gas so as to thereby be able to more accurately control the advance distance of the process that volatilizes and thus removes exposed PR.

Figure 5:
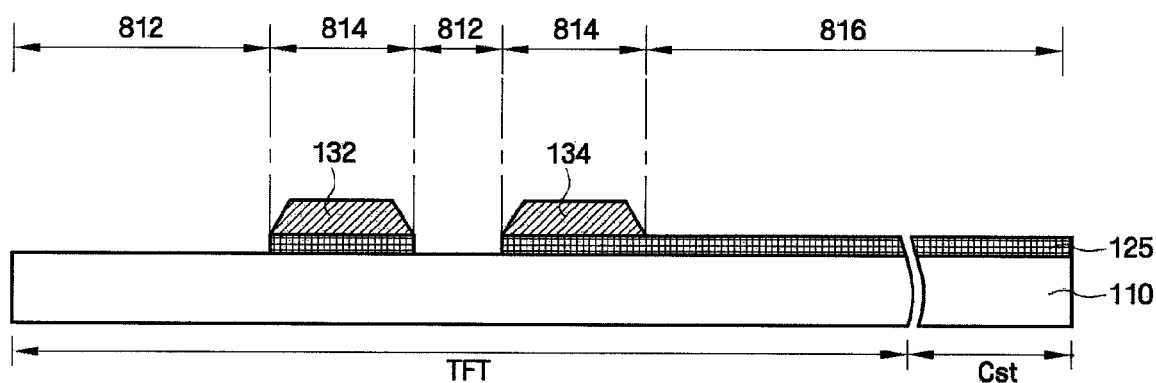

Referring to FIG. 5, the first metal layer 130 is selectively etched with an etch process wherein layer 125 acts as an etch stop or etch barrier to thereby remove the metal over the transparent pixel electrode 125 and thus partially expose the pixel electrode layer 125 and also define the drain electrode 134 as being self aligned with and in good contact with the underlying portion of the pixel electrode layer 125. (Note: In some cases practitioners may alternatively refer to 134 as the source electrode and to 132 as the drain electrode. Yet alternatively they may refer to 132 as a source electrode and to 134 as a drain electrode. The main point is that metal electrode 134 makes a self-aligned good connection to the pixel electrode layer 125 and a to-be-covered and then later re-exposed portion of the pixel-electrode layer 125 extends as part of a monolithic continuum from under metal electrode 134.)

Specifically, first exposure and development processes are performed, and the first metal layer 130 is selectively removed from the semi-transmitting region 816 in which the photoresist PR was thinly coated in a previous process. Here, since the buffer layer 122 and the pixel electrode 125 now have the crystalline structure, their etching speed for an etchant, which is used to etch the first metal layer 130, is substantially reduced and thus they act as an etch barrier. Consequently, the first metal layer 130 is selectively removed from the semi-transmitting region 816, in which the photoresist PR was thinly coated in the previous process, to partially expose the pixel electrode 125. The remaining portion of the first metal layer 130 becomes the drain electrode 134 from under which crystallized layer 125 extends as a continuum.

For example, when the buffer layer 122 and the pixel electrode 125 are made of c-ITO (crystalline) and when the first metal layer 130 is made of metal containing Ag or Cu, the first metal layer 130 may be removed using an etchant which contains less than about 30% phosphoric acid, nitric acid, acetic acid, hydrochloric acid, or sulfuric acid, to partially expose the pixel electrode 125. Here, c-ITO may be etched using an etchant which contains more than 50% phosphoric acid, nitric acid, acetic acid, hydrochloric acid, or sulfuric acid.

Alternatively, when the buffer layer 122 and the pixel electrode 125 are made of c-ITO and when the first metal layer 130 is a single layer of Mo or a triple layer of Mo/Al/Mo, the first metal layer 130 may be wet-etched using an Al etchant to partially expose the pixel electrode 125. In this case, the conductive layer 120 for pixel electrode may include Ga, Zn, Ta, Ti or Al in addition to In or Sn.

Alternatively, the heat treatment process of FIG. 4 may not be performed. In this case, when the buffer layer 122 and the pixel electrode 125 are made of a-ITO and when the first metal layer 130 is a single layer of Mo or a triple layer of Mo/Al/Mo, the first metal layer 130 may be dry-etched with a dry etch process that does not remove material of layer 125 or does not remove it as quickly as material of layer 130 to thereby partially expose the pixel electrode 125. An etching gas used in the dry-etching process may be $Cl_2$, HCl, $BCl_3$, $SF_6$, $CF_4$ or a combination of the same. Since the dry etching process is an anisotropic etching process, more precise patterning can be performed.

Figure 6:
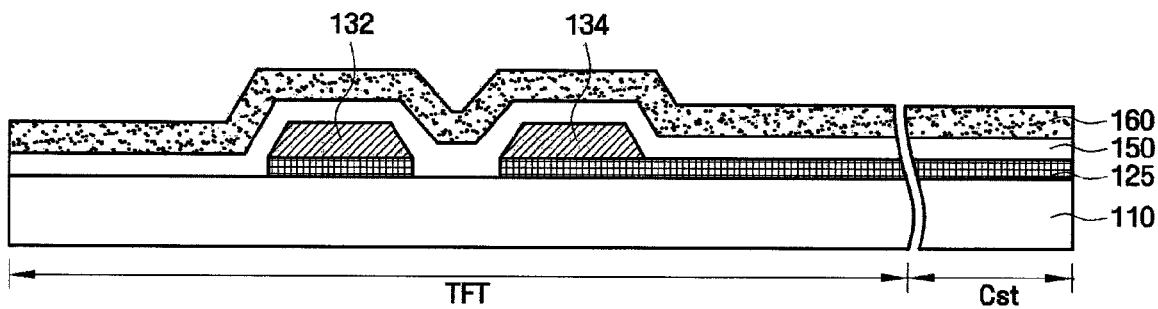

Referring to FIG. 6, an oxide-type semiconductor layer 150 and an insulation layer 160 are sequentially formed one on the next with the semiconductor layer 150 being in contact with the source/drain electrodes 132 and 134 as shown. The oxide-type semiconductor layer 150 may be made of a semiconductive oxide such as one which includes oxygen chemically combined with one or more of Zn, In, Ga and Sn. The effects of using the semiconductive oxide will be described later. Note that a portion of the oxide-type semiconductor layer 150 is disposed in self-aligned manner into the space between and above the source/drain electrodes 132, 134, a portion of the oxide-type semiconductor layer 150 directly contacts substrate 110 and at least a portion of the oxide-type semiconductor layer 150 is protectively covered by insulation layer 160.

The insulation layer 160 may be made of silicon oxide, silicon nitride, silicon oxynitride or a combination of the same and may be formed by chemical vapor deposition (CVD). Alternatively, the insulation layer 160 may be made of organic matter.

Figure 7:
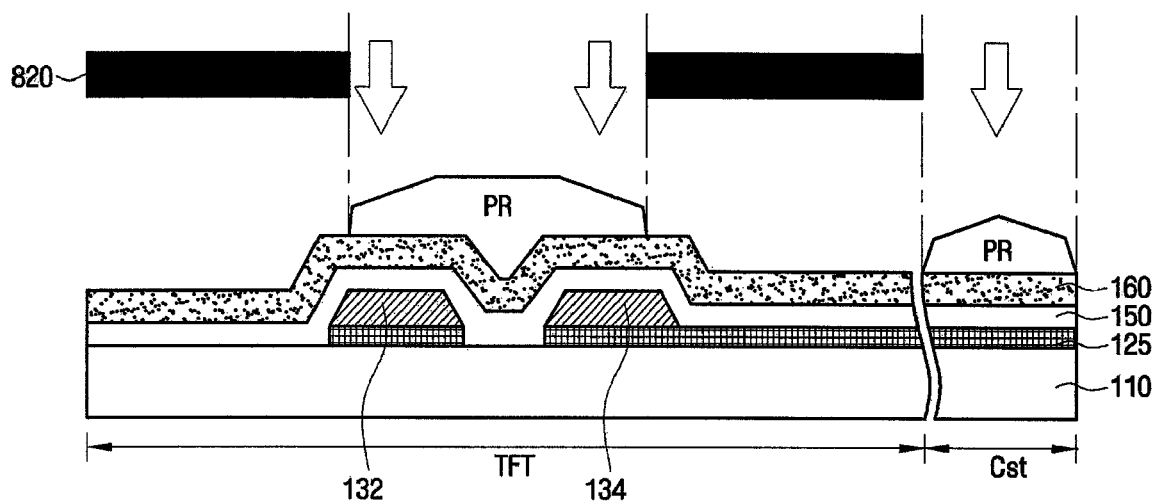
FIGS. 7 through 13 illustrate further processes performed to fabricate an LCD according to a first exemplary embodiment.

Referring to FIG. 7, a photolithography process is performed using a second mask 820. That is, the process of coating the photoresist PR, and the exposure and the development processes are performed so as to begin separation of the TFT structure from the Cst structure.

Figure 8:
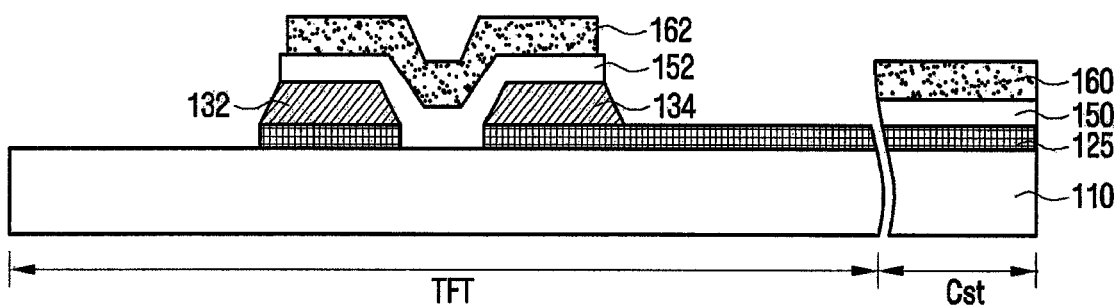

Referring to FIG. 8, a gate insulating film 162 and an active layer 152 are defined by an etch process that uses the PR of FIG. 7 as a mask. Specifically, the insulation layer 160 of FIG. 7 is partially etched to form the gate insulating film 162. In this case, the insulation layer 160 may be dry-etched using, for example, a chlorine (Cl2) and oxygen (O2)-based gas or a sulfur hexafluoride-based gas in the etch plasma.

Next, the oxide-type semiconductor layer 150 of FIG. 7 is partially etched to form the active layer 152 disposed on and over the source electrode 132 and the drain electrode 134. The oxide-type semiconductor layer 150 may be dry-etched or wet-etched. Specifically, the oxide-type semiconductor layer 150 may be dry-etched using a trifluoromethane ($CHF_3$) gas, a tetrafluoromethane ($CF_4$) gas, or an etching gas which contains argon (Ar) or helium (He) in addition to the same.

Alternatively, the oxide-type semiconductor layer 150 may be wet-etched using a dilute solution of hydrofluoric acid (HF) or a solution which contains phosphoric acid, nitric acid, acetic acid, hydrochloric acid, or sulfuric acid. For example, when the oxide-type semiconductive layer 150 is made of zinc oxide (ZnO), it may be wet-etched using an etchant which contains about 5 to 10% phosphoric acid, nitric acid, acetic acid, hydrochloric acid, or sulfuric acid. The oxide-type semiconductor layer 150 may have etch selectivity with respect to the source electrode 132, the drain electrode 134, and the pixel electrode 125 having the crystalline structure, for example, c-ITO.

Figure 9:
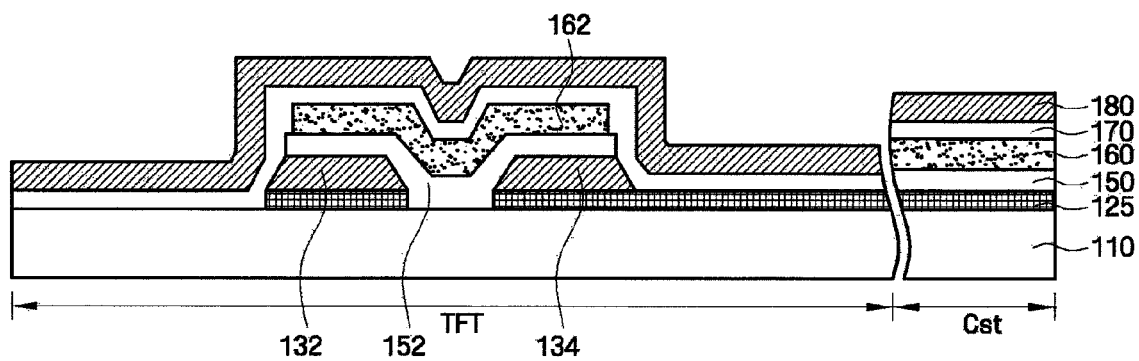

Referring to FIG. 9, a first passivation layer 170 and a second metal layer 180 are sequentially formed one on the other as shown. The first passivation layer 170 may be made of silicon oxide, silicon nitride, silicon oxynitride or a combination of the same and may be formed by CVD. For example, the first passivation layer 170 may be made of an insulating material which has a low dielectric constant and is formed by plasma enhanced chemical vapor deposition (PECVD), such as a-Si:C:O or a-Si:O:F. Alternatively, the first passivation layer 170 may be made of an organic matter having photosensitivity and good planarization characteristics. Still alternatively, the passivation layer 170 may include a lower inorganic layer and an upper organic layer in order to fully protect the active layer 152 while taking advantage of the good planarizability characteristics of the organic layer.

The second metal layer 180 may be formed by PVD. The second metal layer 180 may be a single layer or a multi-layer made of Cu, Mo, Al, Ag, Ti, Nb, W, Cr or Ta, or an alloy of the same. For example, the second metal layer 180 may be made of a material identical to that of the first metal layer 130.

Figure 10:
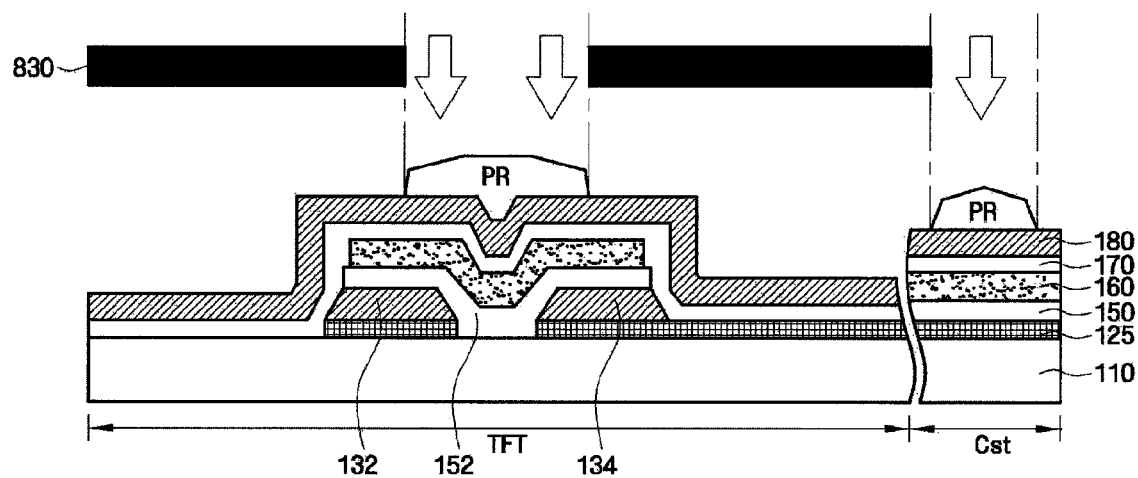

Referring to FIG. 10, a photolithography process is performed using a third mask 830. That is, the process of coating the photoresist PR, and the exposure and the development processes are performed so as to begin separation of the second metal layer 180 into a gate electrode portion and a Cst plate portion.

Figure 11:
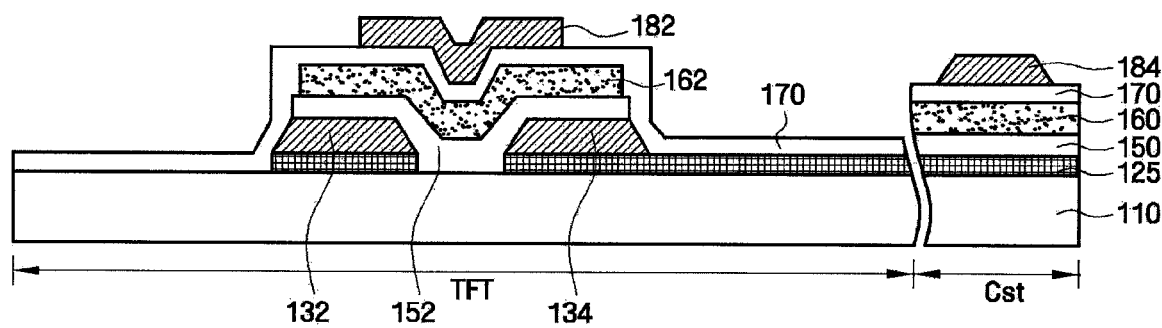

Referring to FIG. 11, the second metal layer 180 (see FIG. 10) in the light-blocking region 812, in which the photoresist PR is not coated, is selectively etched to form a gate electrode 182 and a storage capacitor electrode 184. Layer 170 acts as an etch stop here.

Using the gate insulating layer 162 and the first passivation layer 170 interposed between the gate electrode 182 and the source electrode 132 as dielectrics, a gate-source coupling capacitance Cgs is formed between the metal gate electrode 182 and the metal source electrode 132. Likewise, using the gate insulating layer 162 and the first pasivation layer 170 interposed between the gate electrode 182 and the drain electrode 134 as dielectrics, a gate-drain coupling capacitance Cgd is formed between the metal gate electrode 182 and the metal drain electrode 134.

In addition, using the insulation layer 160 and the first passivation layer 170 interposed between the storage electrode 184 and an underlying portion of the pixel electrode 125, which faces the storage electrode 184, as dielectrics, a storage capacitor Cst is formed between the storage electrode 184 and the underlying portion of the pixel electrode 125. In the present embodiment, dielectrics of the same type and thickness may be used to form the gate-source capacitance Cgs, the gate-drain capacitance Cgd, and the storage capacitor Cst.

Figure 12:
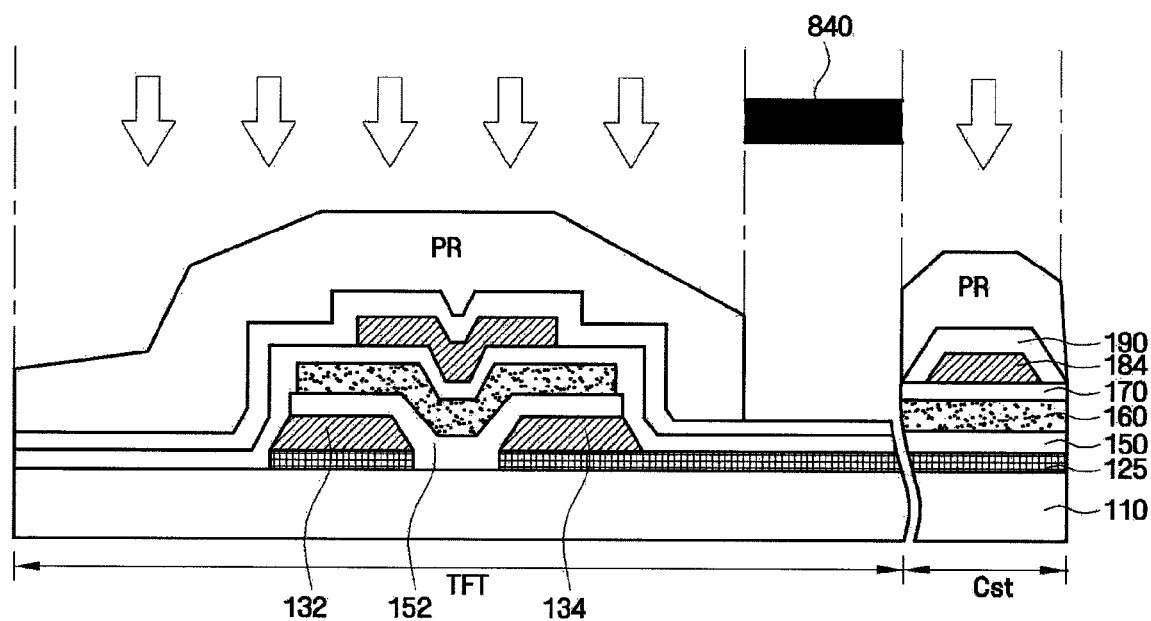

Referring to FIG. 12, a second passivation layer 190 is formed, and a photolithography process is performed using a fourth mask 840. That is, the process of coating the photoresist PR, and the exposure and the development processes are performed.

The second passivation layer 190 may be made of silicon oxide, silicon nitride, silicon oxynitride or a combination of the same and may be formed by CVD. For example, the second passivation layer 190 may be made of an insulating material which has a low dielectric constant and is formed by PECVD, such as a-Si:C:O or a-Si:O:F. Alternatively, the first passivation layer 170 may be made of an organic matter having photosensitivity and superior planarization characteristics. Still alternatively, the passivation layer 170 may include a lower inorganic layer and an upper organic layer in order to fully protect the active layer 152 while taking advantage of the superior characteristics of the organic layer.

Figure 13:
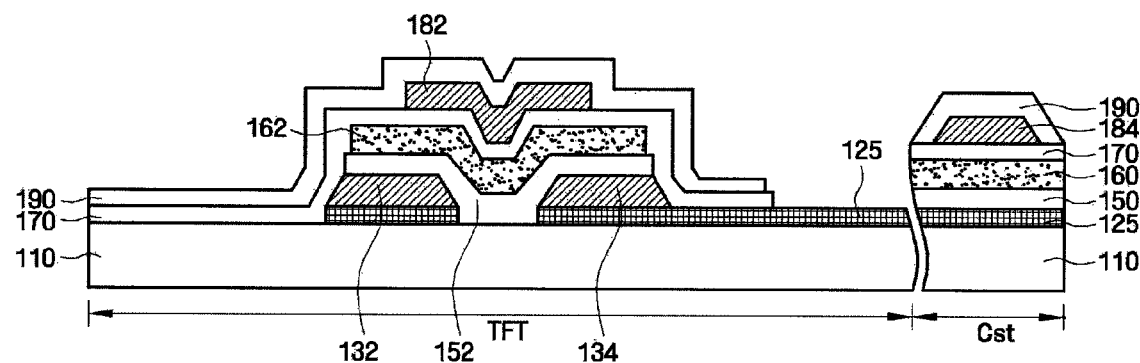

Referring to FIG. 13, the second passivation layer 190 and the first passivation layer 170 in the light-blocking region 812, in which the photoresist PR is not coated, are selectively etched to partially expose the pixel electrode 125. The illustrated TFT structure is produced from the above steps. Of note, the metal electrode 134 is in good and self aligned contact with the pixel-electrode 125 and also in good and inwardly self aligned contact with the active layer 152.

Though not illustrated, in an LCD according to the first embodiment of the present invention, if soda lime glass is used as an insulation substrate 110, a barrier layer (not shown) can be further interposed between the insulation substrate 110 and the active layer 152. It is because, if the soda lime glass is used as an insulation substrate 110, alkali ions, which remain within soda lime in the manufacturing process, can be erupted. As a barrier layer, materials such as silicon nitride (SiNx) and/or silicon oxide (SiOx) can be used. Properties of the LCD according to the first exemplary embodiment (FIGS. 1-13) will now be described.

First, a TFT included in the LCD according to the first exemplary embodiment has a top-gate structure in which the active layer 152 is formed on and self-aligned between the source electrode 132 and the drain electrode 134 and in which the gate electrode 182 is formed and insulatively disposed above the active layer 152.

Since the active layer 152 is formed on (and thus after) the source electrode 132 and the drain electrode 134, the etch selectivity of the active layer 152 relative to the source electrode 132 and the drain electrode 134 need not be taken into consideration when the source electrode 132 and the drain electrode 134 are patterned. However, if the source electrode and the drain electrode had instead been formed (hypothetically) on an earlier formed active layer and then patterned, the active layer may be damaged when the source electrode and the drain electrode are afterward patterned. Therefore, this top-gate structure is immune to etch damage to the active layer 152, this being particularly important if the active layer 152 is made of a material having high etching speed for an etchant which is used to etch a metal layer so as to make the source and drain electrodes.

Since the first passivation layer 170 may be formed on the active layer 152, it can protect the active layer 152. Specifically, the first passivation layer 170 may protect the active layer 152, which is may be made of a material sensitive to external contaminants from the external environment. For example, an oxide-type semiconductor, such as ZnO, is sensitive to the external environment, in particular, humidity and can be disadvantageously altered if attacked by moisture.

In addition, in a TFT having a bottom-gate structure, a first passivation layer like 170 may be present to function as an etch stopper which deters an active layer from being etched simultaneously with dielectric 160. When the TFT having the bottom-gate structure is manufactured using the etch stopper, an additional mask may be required thus increasing mass production costs and increasing the risk of something going wrong due to increase of distinct manufacturing steps. However, since the TFT according to the first exemplary embodiment of the present disclosure does not require an additional mask, its processing costs can be reduced and reliability of mass production can be enhanced.

Second, processing efficiency can be enhanced using four masks, i.e., the first through fourth masks 810 through 840. Whenever a mask is used, the process of coating the photoresist PR, and the exposure and development processes must be performed. Therefore, as the number of masks used increases, mass production processing efficiency and reliability tend to deteriorate. However, according to the first exemplary embodiment, the source electrode 132, the drain electrode 134, and the pixel electrode 152 can be formed and aligned one with respect to the other using one mask.

Third, since the active layer 152 is made of an oxide-type semiconductor, which includes one or more of Zn, In, Ga and Sn, the reliability of the TFT can be enhanced. That is, the field effect mobility of the active layer 152 can be enhanced, and the TFT can show superior switching characteristics, for example, an ON versus OFF current ratio of $10^5$ to $10^7$.

Specifically, examples of the oxide semiconductor, which contains one or more of Zn, In, Ga and Sn, may include ZnO, InGaZnO4, Zn—In—O, and Zn—Sn—O whose field effect mobility is 10 to 100 times greater than that of hydrogenated amorphous silicon (a-Si:H). For example, if the oxide semiconductor mixed with $In_2O_3$, $Ga_2O_3$ or ZnO which has the amorphous structure, is used for the active layer 152, the field effect mobility of the active layer 152 may become more than 20 times greater that of dehydrogenated amorphous silicon (a-Si). In particular, when the active layer 512 is made of ZnO, a maximum of 200 $cm^2$/V·s can be obtained in theory, and this value is equal to a value which can be obtained when the active layer 512 is made of polysilicon (p-Si).

In addition, the problem of afterimage, which is generated when leakage current of the active layer 152 increases after the TFT is exposed to visible light, can be reduced.

Specifically, if the active layer 152 of the TFT is made of a-Si:H, a-Si:H absorbs most of energy in a visible-light region (380 nm to 780 nm) having an energy range of 1.59 eV to 3.26 eV since the optical band gap of a-Si:H is less than 1.8 eV. Therefore, when the TFT is exposed to visible light, the active layer 152 may experience serious leakage of current. In order to solve this problem, a TFT (not shown) having a bottom-gate staggered structure may be used. However, it does not fundamentally remove leakage current caused by an active layer which is not covered by a gate electrode.

In contrast, if the active layer 152 of the TFT is made of an oxide-type semiconductor which includes one or more of Zn, In, Ga and Sn, the oxide semiconductor does not absorb most of energy in the visible-light region since it is generally an n-type semiconductor having an optical band gap of 3.2 eV to 3.4 eV. Thus, the leakage current of the active layer 152 is not great. For example, if an oxide semiconductor mixed with $In_2O_3$, $Ga_2O_3$ or ZnO, which has the amorphous structure, is used for the active layer 152, even when the TFT is exposed to visible light, the leakage current of the active layer 152 is increased by only a very small amount from the amount of leakage current in a dark state. Therefore, the problem of afterimage caused by an increase of leakage current in the active layer 152 after the TFT is exposed to visible light can be reduced.

In addition, when the active layer 152 is made of an oxide-type semiconductor which includes one or more of Zn, In, Ga and Sn, the uniformity of TFT characteristics can also be enhanced, as compared to when the active layer 152 is made of p-Si.

Specifically, in order to form the active layer 152 made of p-Si, a-Si is deposited by CVD and then dehydrogenated. Next, a laser crystallization process, such as laser annealing, is performed on the dehydrogenated a-Si, and impurities, such as boron, are ion-implanted into the result of the laser crystallization process. In this case, there are limitations on uniformly forming p-Si on the entire region of the insulation substrate 110. If p-Si of the active layer 152 of each TFT is not uniform, the TFTs may show different characteristics.

In contrast, since an oxide semiconductor, which includes one or more of Zn, In, Ga and Sn, is amorphous, the uniformity of the active layer 152 can be enhanced, which, in turn, enhances the uniformity of TFT characteristics.

Furthermore, an oxide semiconductor, which includes one or more of Zn, In, Ga and Sn, can be processed at relatively low temperatures and can be used for a flexible LCD containing organic matter that is sensitive to high temperatures, such as plastic. Also, the oxide semiconductor can be used for an LCD having an array-on-color filter (AOC) structure or a color filter-on-array (COA) structure, which will be described later.

An LCD and a method of fabricating the same according to a second exemplary embodiment will now be described with reference to common FIGS. 1 through 6 in combination with FIGS. 14 through 20. FIGS. 14 through 20 illustrate processes performed to fabricate the LCD according to the second exemplary embodiment. Elements substantially identical to those of the first exemplary embodiment are indicated by like reference numerals, and a detailed description of the elements and the processes, which have been described above in relation to the first exemplary embodiment, will be omitted.

Referring to FIG. 1, a conductive layer 120 for pixel electrode and a first metal layer 130 are sequentially formed on an insulation substrate 110.

Referring to FIG. 2A and FIG. 2B, a photolithography process is performed using a first mask 810, which includes slits 816 and is illustrated in FIG. 2A, or a first mask 815 including a semi-transmitting portion 818 illustrated in FIG. 2B.

Referring to FIG. 3, a pixel electrode 125 and a buffer layer 122 are formed.

Referring to FIG. 4, a heat treatment process and a process of reducing the thickness of each photoresist pattern are performed.

Referring to FIG. 5, the pixel electrode 125 is partially exposed, and a drain electrode 134 is formed.

Referring to FIG. 6, an oxide semiconductor layer 150 and an insulation layer 160 are sequentially formed.

Figure 14:
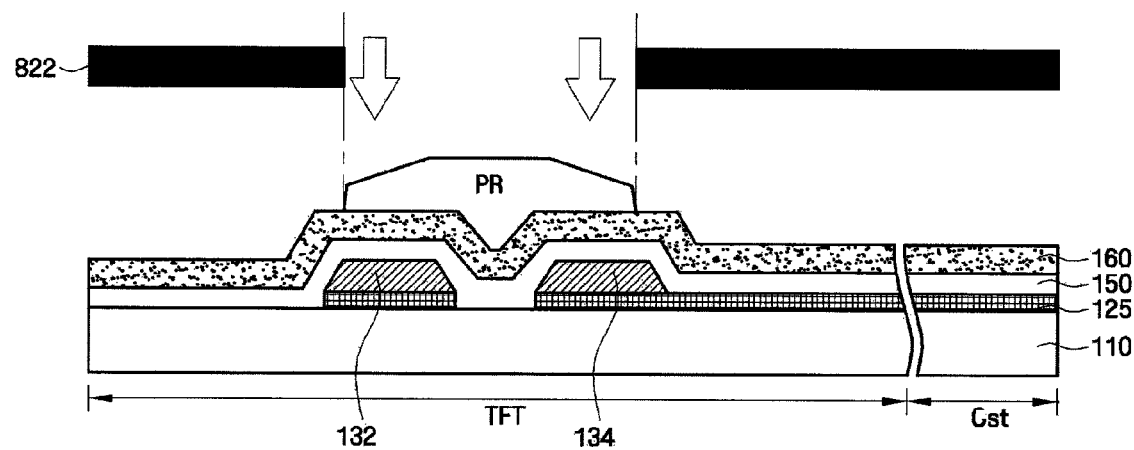
FIGS. 14 through 20 illustrate further processes performed to fabricate an LCD according to a second exemplary embodiment.

Referring to FIG. 14 as the next step following that of FIG. 6, a photolithography process is performed using a second mask 822. That is, the process of coating photoresist PR and the exposure and development processes are performed.

Unlike the second mask 820 according to the first exemplary embodiment, the second mask 822 according to the second exemplary embodiment blocks light from entering a region in which the storage capacitor Cst will be formed. (As will be seen in FIG. 18 the dielectric of the Cst will thus not be exactly the same as that of the TFT.)

Figure 15:
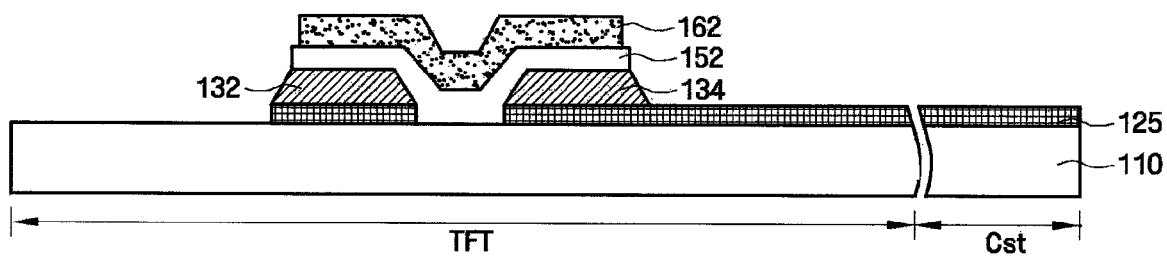

Referring to FIG. 15, a gate insulating film 162 and an active layer 152 are formed. Specifically, the insulation layer 160 (see FIG. 14) is partially etched to form the gate insulating film 162, and the oxide semiconductor layer 150 (see FIG. 14) is partially etched to form the active layer 152. Unlike in the first exemplary embodiment, the insulation layer 160 and the oxide semiconductor layer 150 in the region, in which the storage capacitor Cst is formed, are also etched in the second exemplary embodiment.

Figure 16:
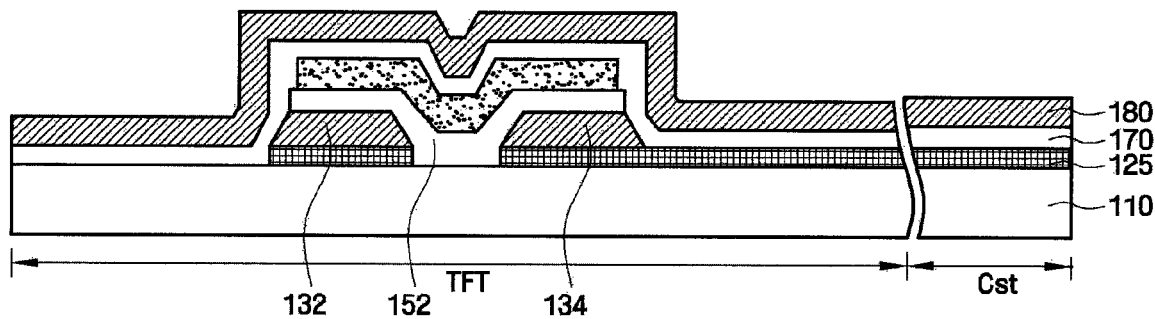

Referring to FIG. 16, a first passivation layer 170 and a second metal layer 180 are sequentially formed.

Figure 17:
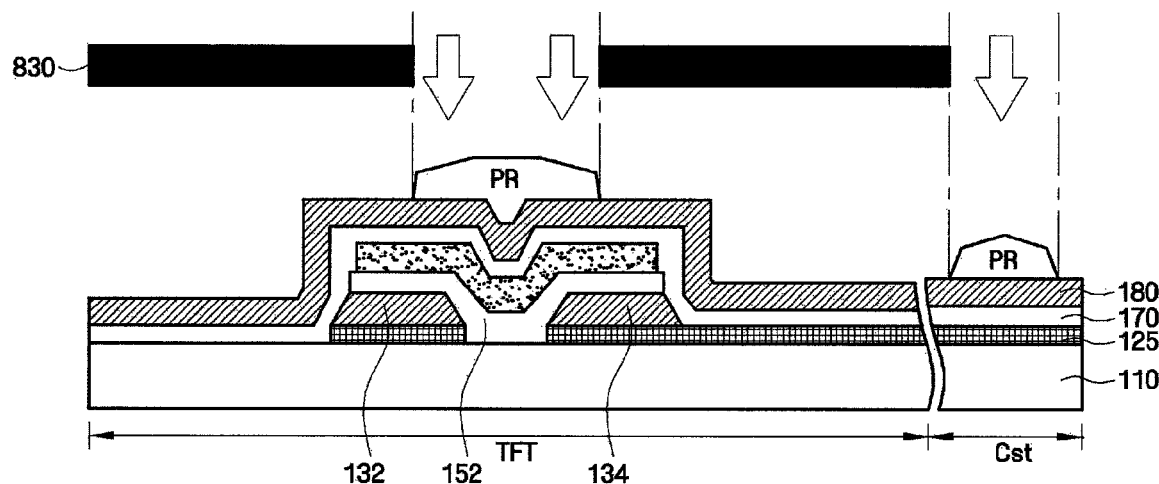

Referring to FIG. 17, a photolithography process is performed using a third mask 830.

Figure 18:
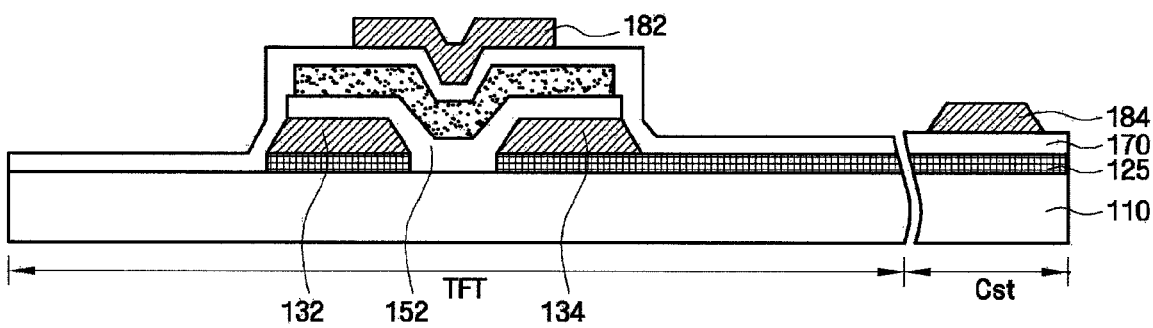

Referring to FIG. 18, a gate electrode 182 and a storage electrode 184 are formed.

In the first exemplary embodiment (see FIG. 13), the insulation layer 160 and the first passivation layer 170 are interposed between the storage electrode 184 and the portion of the pixel electrode 125 which faces the storage electrode 184. However, in the second exemplary embodiment, only the first passivation layer 170 is interposed between the storage electrode 184 and a portion of the pixel electrode 125 which faces the storage electrode 184. Since only the first passivation layer 170 is a dielectric which forms a storage capacitance between the storage electrode 184 and the portion of the pixel electrode 125 which faces the storage electrode 184, the storage capacitance according to the second exemplary embodiment may be larger than that according to the first exemplary embodiment. Thus, the storage capacitance according to the second embodiment can be effectively used in a structure which requires a high voltage-holding ratio (VHR).

Figure 19:
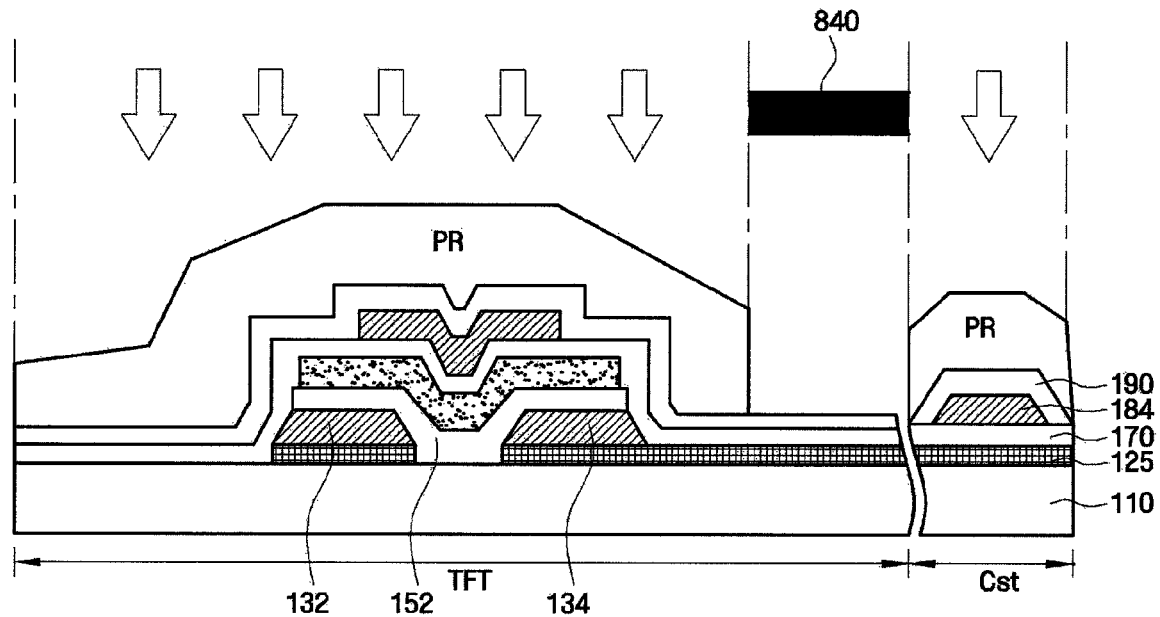

Referring to FIG. 19, a second passivation layer 190 is formed, and a photolithography process is performed using a fourth mask 840.

Figure 20:
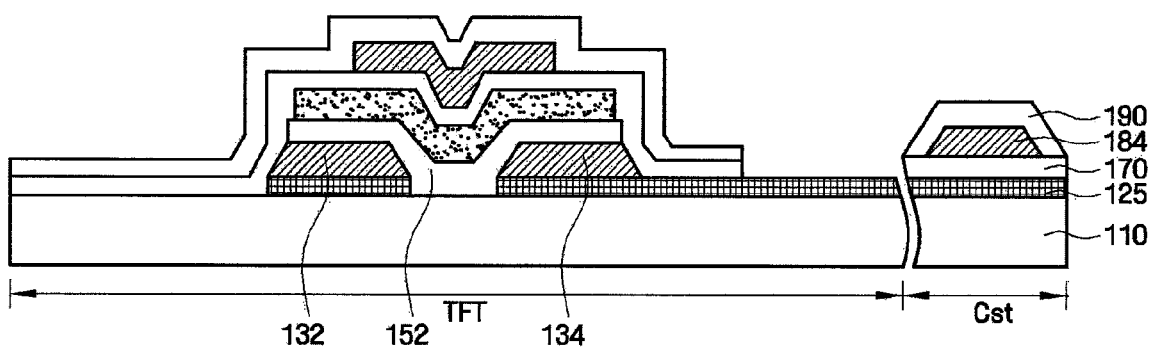

Referring to FIG. 20, in a region, in which the photoresist is not coated, the second passivation layer 190 and the first passivation layer 170 are etched to partially expose the pixel electrode 125.

The LCD according to the second exemplary embodiment also has properties of the LCD according to the first exemplary embodiment. Therefore, the processing efficiency and reliability of TFTs according to the second exemplary embodiment can also be enhanced.

An LCD and a method of fabricating the same according to a third exemplary embodiment will now be described with reference to FIGS. 1 through 6 in combination with FIGS. 21 through 25. FIGS. 21 through 25 illustrate processes performed to fabricate the LCD according to the third exemplary embodiment wherein the metal gate electrode 182 directly contacts dielectric layer 160 (FIG. 22). Elements substantially identical to those of the first exemplary embodiment are indicated by like reference numerals, and a detailed description of the elements and the processes, which have been described above in relation to the first exemplary embodiment, will be omitted.

Referring to FIG. 1, a conductive layer 120 for pixel electrode and a first metal layer 130 are sequentially formed on an insulation substrate 110.

Referring to FIG. 2A and FIG. 2B, a photolithography process is performed using a first mask 810, which includes slits 816 and is illustrated in FIG. 2A, or using a first mask 815 including a semi-transmitting portion 818 illustrated in FIG. 2B.

Referring to FIG. 3, a pixel electrode 125 and a buffer layer 122 are formed.

Referring to FIG. 4, a heat treatment process and a process of reducing the thickness of each photoresist pattern are performed.

Referring to FIG. 5, the pixel electrode 125 is partially exposed, and a drain electrode 134 is formed.

Referring to FIG. 6, an oxide semiconductor layer 150 and an insulation layer 160 are sequentially formed.

Figure 21:
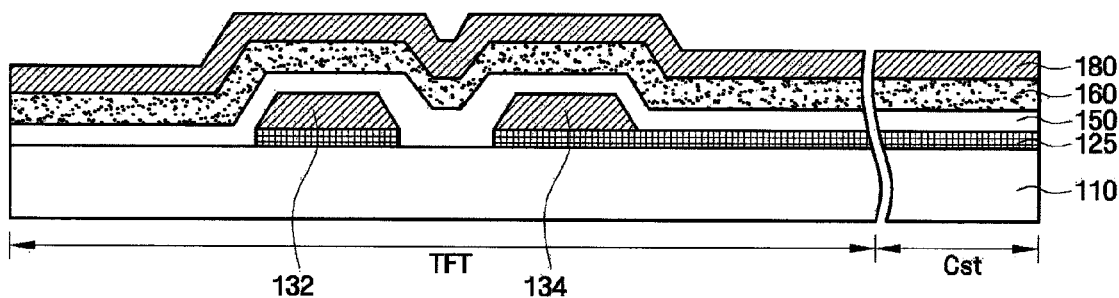
FIGS. 21 through 25 illustrate further processes performed to fabricate an LCD according to a third exemplary embodiment.
Figure 22:
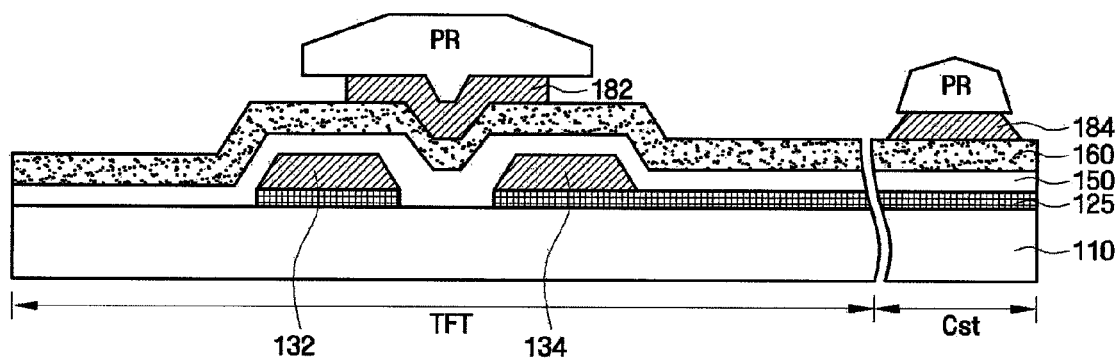

Referring to FIG. 21, which in this embodiment flows the step of FIG. 6, a second metal layer 180 is formed directly on insulation layer 160.

Referring to FIG. 22, a gate electrode 182 and a storage electrode 184 are formed. Specifically, a photolithography process is performed using a second mask (not shown), and the second metal layer 180 is etched. As a result, portions of the second metal layer 180 remain to form the gate electrode 182 and the storage electrode 184, respectively.

Figure 23:
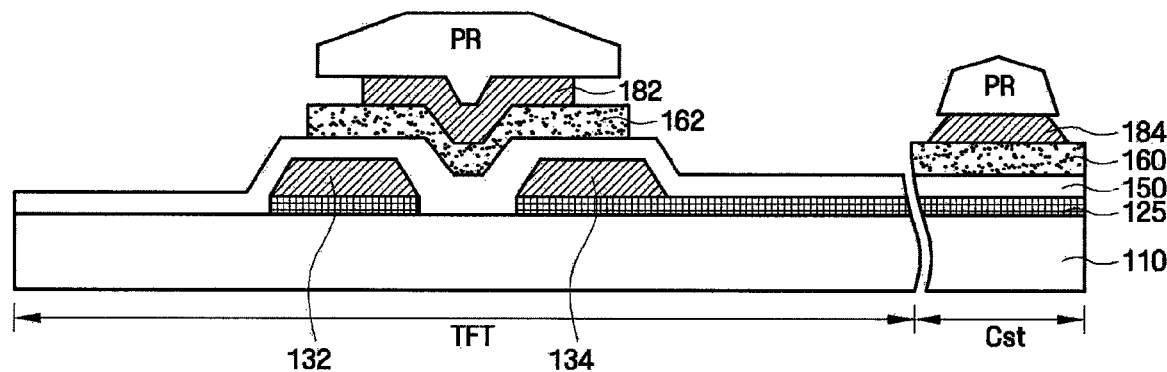
Figure 24:
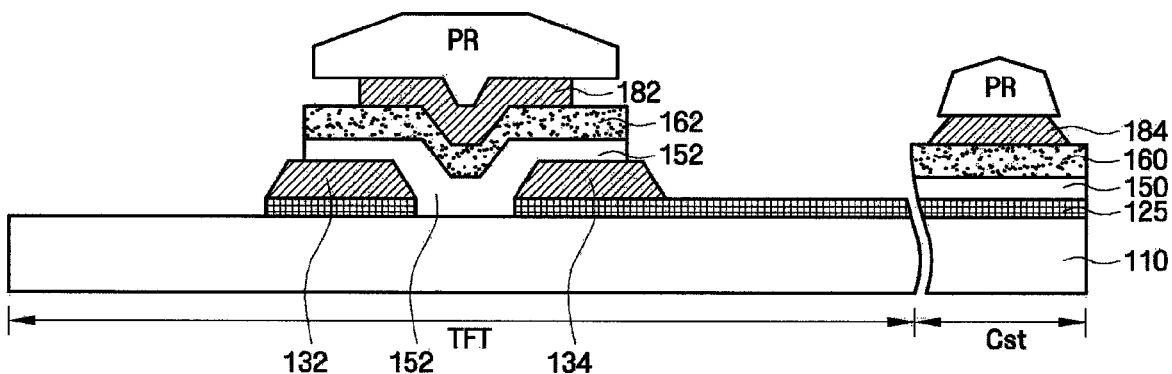

Referring to FIG. 23, a gate insulating layer 162 is formed.

Using the photoresist patterns previously used, the insulation layer 160 (see FIG. 22) is etched. Then, portions of the insulation layer 160 remain. One of the remaining portions becomes the gate insulating layer 162, and the other one becomes a dielectric of a storage capacitor Cst.

Specifically, using the gate insulating layer 162 interposed between the gate electrode 182 and a source electrode 132 as a dielectric, a gate-source capacitance Cgs is formed between the gate electrode 182 and the source electrode 132. Likewise, using the gate insulating layer 162 interposed between the gate electrode 182 and the drain electrode 134 as a dielectric, a gate-drain capacitance Cgd is formed between the gate electrode 182 and the drain electrode 134.

In addition, using the insulation layer 160 interposed between the storage electrode 184 and a portion of the pixel electrode 125, which faces the storage electrode 184, as a dielectric, the storage capacitor Cst is formed between the storage electrode 184 and the portion of the pixel electrode 125 which faces the storage electrode 184. In the present embodiment, dielectrics of the same type and thickness may be used to form the gate-source capacitance Cgs, the gate-drain capacitance Cgd, and the storage capacitor Cst.

Referring to 24, boundaries of the active layer 152 are defined. Using the photoresist patterns previously used, the oxide semiconductor layer 150 (see FIG. 23) is etched. Then, a portion of the oxide semiconductor layer 150 remains to form the active layer 152 of the TFT.

Figure 25:
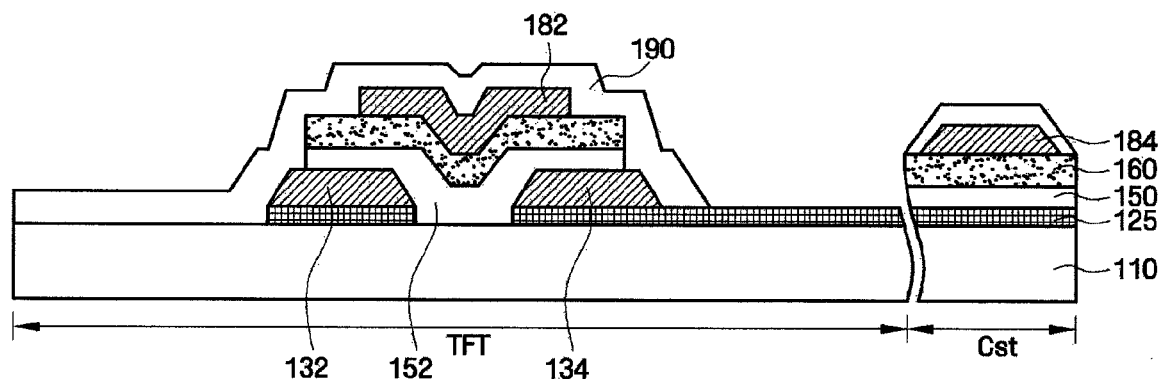

Referring to FIG. 25, a passivation layer 190 is formed, and the pixel electrode 125 is partially exposed. Since the passivation layer 190 is substantially identical to the second passivation layer 190 according to the first exemplary embodiment, a detailed description thereof will be omitted.

After the passivation layer 190 is formed, a photolithography process is performed using a third mask (not shown), and the passivation layer 190 is etched to partially expose the pixel electrode 125.

The LCD according to the third exemplary embodiment also has properties the LCD according to the first exemplary embodiment. Therefore, the processing efficiency and reliability of TFTs according to the third exemplary embodiment can also be enhanced.

However, since each TFT included in the LCD according to the third exemplary embodiment does not include the first passivation layer 170 (see FIG. 13) included in each TFT included in the LCD according to the first exemplary embodiment. In addition, since three masks are used, processing efficiency can further be enhanced.

The exemplary embodiments of the present invention described above can be applied to various forms of LCDs.

If the insulation substrate 110 described above is referred to as a first substrate, the LCD may include a second substrate facing the first substrate. On the second substrate, a transparent common electrode facing a portion of the pixel electrode 152, which is exposed in the exemplary embodiments, may be formed. The exemplary embodiments may be used not only with a structure in which a color filter is formed on the second substrate, but also to a structure in which a color filter is formed on the first substrate. As an example of the latter, the exemplary embodiments may be used with an LCD having the AOC structure or the COA structure.

Figure 26:
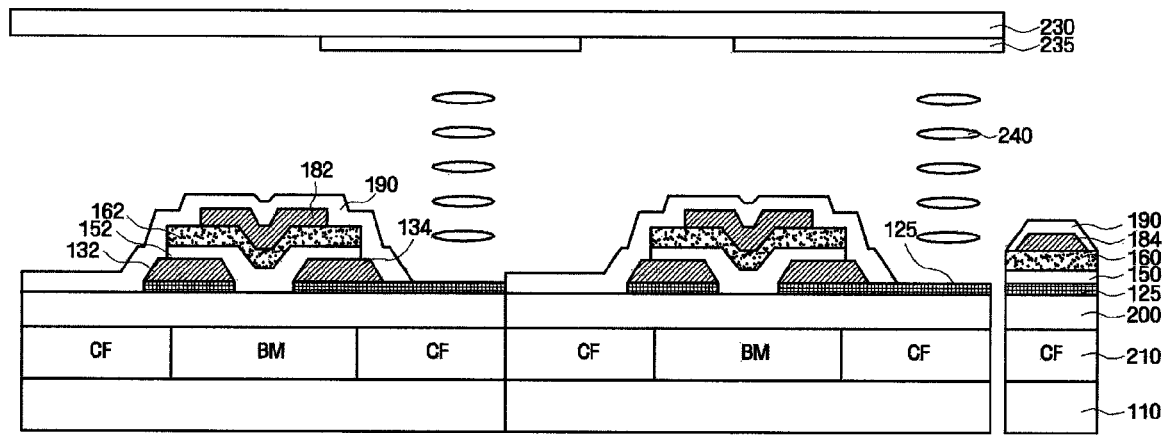
FIG. 26 illustrates a case where an exemplary embodiment of the present disclosure as applied to an LCD having an array-on-color filter (AOC) structure.

A case where the exemplary embodiments are applied to an LCD having the AOC structure will now be described with reference to FIG. 26. FIG. 26 illustrates a case where an exemplary embodiment of the present disclosure is applied to an LCD having the AOC structure. In FIG. 26, the TFTs according to the third exemplary embodiment are used. However, the TFTs according to the first or second exemplary embodiments of the present disclosure may also be used.

Referring to FIG. 26, a layer 210 which includes color filters CF and black matrices BM is formed on an insulation substrate 110. In here, the color filters CF includes red (R), green (G) and blue (B). And black matrices BM are disposed at positions facing the TFTs. Each of the black matrices BM absorbs light which is diffusedly reflected. In addition, an overcoat layer 200 is formed on the layer 210 which includes the color filters CF and the black matrices BM. The overcoat layer 200 is made of an insulating material and is formed for planarization. The overcoat layer 200 may be made of organic matter having superior planarization characteristics. Alternatively, the overcoat layer 200 is made of inorganic matter.

The TFTs according to the third exemplary embodiment are formed on the overcoat layer 200. A pixel electrode 125 of each TFT is partially exposed, and a common electrode 235, which faces an exposed portion of the pixel electrode 125, is formed on the second substrate 230. A liquid crystal molecular layer 240 is interposed between the exposed portion of the pixel electrode 125 and the common electrode 235.

While various embodiments have been particularly shown and described herein, it will be understood by those of ordinary skill in the art in view of the above that various changes in form and detail may be made therein without departing from the spirit and scope of the present disclosure. Thus the exemplary embodiments should be considered in a descriptive sense only and not for purposes of limitation.

What is claimed is:

1. A liquid crystal display (LCD) comprising:
a pixel electrode and a buffer layer formed of a same conductive material and on an insulation substrate, wherein the buffer layer is spaced apart from the pixel electrode and is formed on a same level with the pixel electrode;
a source electrode formed on the buffer layer and of a material different from that of the conductive material used in forming the pixel electrode and the buffer layer;
a drain electrode formed on a first portion of the pixel electrode, where a second portion of the pixel electrode is not covered by the drain electrode;
an active layer formed on and extending between the source electrode and the drain electrode;
a gate electrode formed above the active layer; and
a first gate insulating layer interposed between the gate electrode and the active layer;
wherein the second portion of the pixel electrode is not covered by the first gate insulating layer; and
wherein the same conductive material used in forming the buffer layer and the pixel electrode includes a transparent conductive film wherein at least an upper portion thereof is of a crystalline structure that resists being etched more so than an amorphous version of the same conductive material.

2. The LCD of claim 1, wherein the active layer includes an oxide-type semiconductor which comprises oxygen and one or more of zinc (Zn), indium (In), gallium (Ga) and tin (Sn).

3. The LCD of claim 1, wherein the first gate insulating layer is made of organic matter, silicon oxide, silicon nitride, silicon oxynitride or a combination of the same.

4. The LCD of claim 1, further comprising a first passivation layer interposed between the active layer and the gate electrode, wherein the first passivation layer is made of organic matter, silicon oxide, silicon nitride, silicon oxynitride or a combination of the same, and
wherein the second portion of the pixel electrode is not covered by the first passivation layer.

5. The LCD of claim 4, further comprising a second passivation layer on the first passivation layer and the gate electrode, wherein the first passivation layer and the second passivation layer do not cover and thus expose a portion of the pixel electrode.

6. The LCD of claim 1, further comprising a color filter interposed between the insulation substrate and the pixel electrode.

7. The LCD of claim 6, further comprising an overcoat layer interposed between the pixel electrode and the color filter, wherein the overcoat layer is made of organic matter, silicon oxide, silicon nitride, silicon oxynitride or a combination of the same.

8. The LCD of claim 1, further comprising a barrier layer interposed between the insulation substrate and the active layer, wherein the insulation substrate is made of soda-lime glass.

9. A liquid crystal display (LCD) comprising:
a pixel electrode and a buffer layer formed of a same conductive material and on an insulation substrate, wherein the buffer layer is spaced apart from the pixel electrode and is formed on a same level with the pixel electrode;
a source electrode formed on the buffer layer and of a material different from that of the conductive material used in forming the pixel electrode and the buffer layer;
a drain electrode formed on a first portion of the pixel electrode, where a second portion of the pixel electrode is not covered by the drain electrode;
an active layer formed on and extending between the source electrode and the drain electrode;
a gate electrode formed above the active layer;
a first gate insulating layer interposed between the gate electrode and the active layer;
wherein the second portion of the pixel electrode is not covered by the first gate insulating layer;
a first passivation layer interposed between the active layer and the gate electrode, wherein the first passivation layer is made of organic matter, silicon oxide, silicon nitride, silicon oxynitride or a combination of the same;
wherein the second portion of the pixel electrode is not covered by the first passivation layer; and
a storage electrode formed above a portion of the material of the pixel electrode and made of a material identical to that of the gate electrode, wherein the first passivation layer and a portion of the first gate insulating layer are interposed between a third portion of the pixel electrode and the storage electrode.

10. The LCD of claim 9, further comprising a storage electrode formed above the third portion of the pixel electrode and made of a material identical to that of the gate electrode, wherein the first passivation layer is interposed between the third portion of the pixel electrode and the storage electrode.

11. A thin film transistor (TFT) comprising:
a source electrode and a drain electrode formed a of a first conductive material and disposed above an insulation substrate so as to be spaced apart from each other;
an oxide-type semiconductive layer extending over and between the source electrode and the drain electrode;
a gate electrode disposed insulatively above the source electrode, the drain electrode, and the oxide-type semiconductive layer;
a gate insulating layer interposed between the gate electrode and the oxide-type semiconductive layer;
a buffer layer and a pixel electrode formed of a same second conductive material which is different that the first conductive material, the buffer layer and the pixel electrode being respectively disposed under and in direct contact with the source electrode and the drain electrode respectively and being also spaced apart one from the other, wherein the buffer layer is formed on a same level as that of the pixel electrode,
wherein the second conductive material includes a transparent conductive oxide;
wherein a portion of the pixel electrode is not covered by the gate insulating layer; and
the transparent conductive oxide has a crystalline portion at its top, the crystalline portion of the transparent conductive oxide being more resistant to being etched than an amorphous version of the same transparent conductive oxide.

12. The TFT of claim 11 wherein: the oxide-type semiconductive layer contacts the insulation substrate.

13. The TFT of claim 11 wherein:
the first conductive material of the source electrode includes a first metal.

14. The TFT of claim 11 wherein: the oxide-type semiconductive layer comprises crystallized semiconductive material.

* * * * *